United States Patent [19]

Colles

[11] Patent Number: 4,904,922
[45] Date of Patent: Feb. 27, 1990

[54] APPARATUS FOR CONVERTING BETWEEN DIGITAL AND ANALOG VALUES

[75] Inventor: Joseph H. Colles, Oceanside, Calif.

[73] Assignee: Brooktree Corporation, San Diego, Calif.

[21] Appl. No.: 225,055

[22] Filed: Jul. 26, 1988

Related U.S. Application Data

[62] Division of Ser. No. 104,690, Oct. 5, 1987, Pat. No. 4,831,282, which is a division of Ser. No. 714,503, Mar. 21, 1985, abandoned.

[51] Int. Cl.⁴ .............................................. G05F 3/08
[52] U.S. Cl. .................................... 323/316; 341/136; 307/448; 307/576
[58] Field of Search ........................ 323/312, 315, 316; 341/135, 136; 307/448, 451, 571, 576

[56] References Cited

U.S. PATENT DOCUMENTS

| | | | |
|---|---|---|---|
| 3,845,324 | 10/1974 | Feucht | 307/448 |
| 4,340,867 | 7/1982 | Sano | 307/448 |
| 4,384,274 | 5/1983 | Mao | 341/136 |
| 4,638,241 | 1/1987 | Colles | 323/312 |
| 4,689,607 | 8/1987 | Robinson | 341/136 |
| 4,706,013 | 11/1987 | Kuo | 323/316 |
| 4,733,196 | 3/1988 | Menniti et al. | 323/315 |

*Primary Examiner*—Peter S. Wong
*Attorney, Agent, or Firm*—Ellsworth R. Roston; Charles H. Schwartz

[57] ABSTRACT

Output members in a matrix relationship having x and y inputs respectively receive signals in first and second pluralities cumulatively representing a digital value. These signals are decoded and are respectively introduced to the x and y inputs to activate a particular output member common to a selected x row and a selected y column. The output members in the preceding rows and preceding the activated output member in the selected row are also activated. Three-transistor (all of the same type) current sources provide constant currents to the activated output members. In each current source, a first transistor provides the constant current, a second transistor in each current source constitutes a switch operative in response to binary input signals, and a third transistor receives the constant current dependent upon the binary input to the second transistor. A circuit providing first and second reference voltages and including an operational amplifier produces a resultant voltage representing the difference between the reference voltages. The resultant voltage controls the current flowing through fourth and fifth transistors, preferably in series, thereby regulating the value of the first reference voltage. The amplifier output also regulates the current in the first transistor of each current cell, and the voltage from the fifth transistor biases the third transistor in each current cell toward a conductive state. The three transistors in each current source and the fourth and fifth transistors may be C-MOS transistors of the p type.

35 Claims, 4 Drawing Sheets

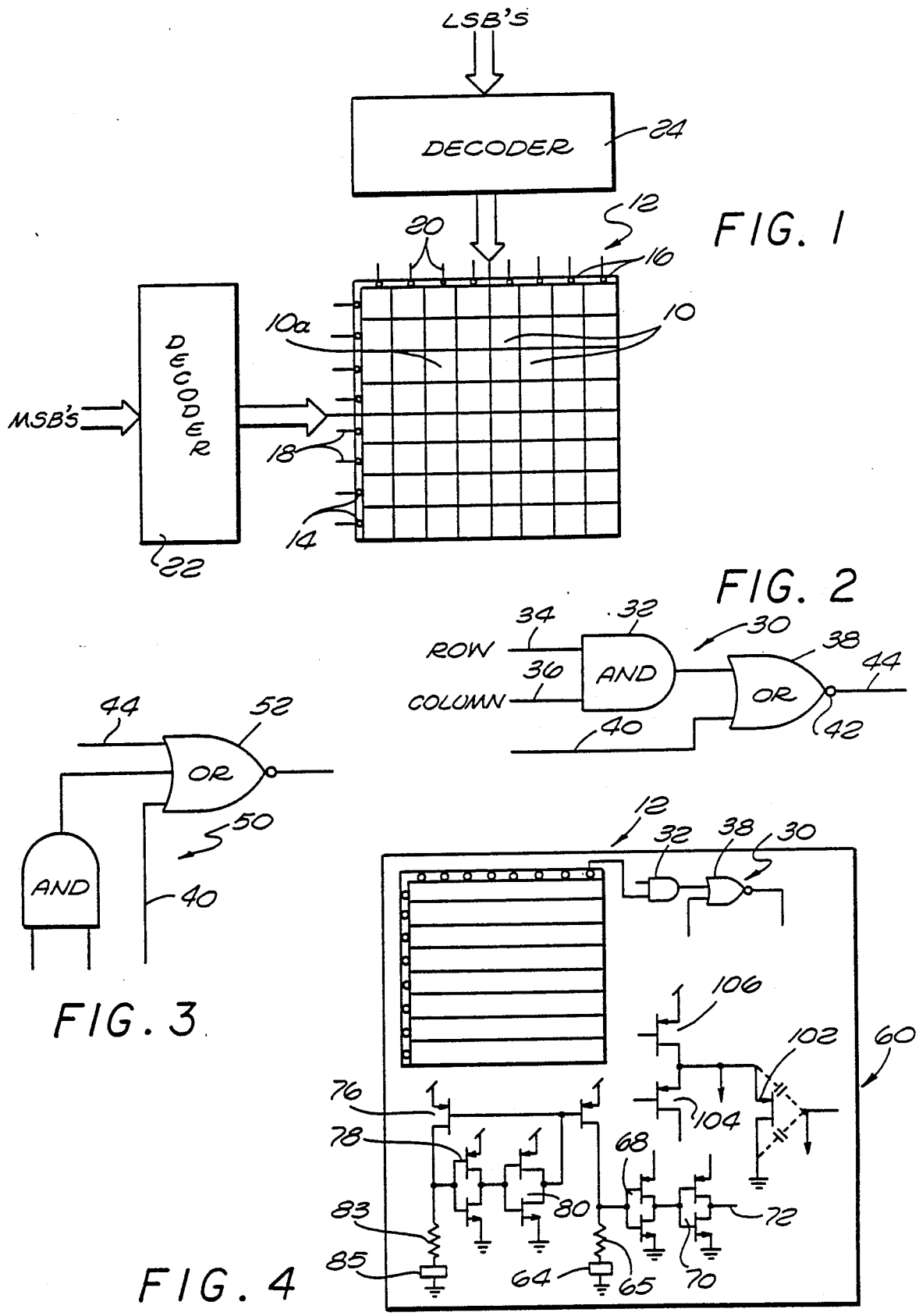

APPARATUS FOR CONVERTING BETWEEN DIGITAL AND ANALOG VALUES

This is division of application Ser. No. 104,690 U.S. Pat. No. 4,831,282 filed Oct. 5, 1987, which in turn is a division of application Ser. No. 714, 503 filed Mar. 21, 1985, now abandoned.

This invention relates to systems for converting between digital and analog values. The system is particularly advantageous because it is constructed to operate on a monotonic basis in a simple and straightforward manner to provide accurate indications of analog values. The system is also advantageous because it is able to operate at high speeds to provide such analog indications.

Various types of equipment receive information in analog form. Such equipment includes process control equipment, measuring instruments, communication equipment and a wide variety of other equipments. Digital computers and data processing systems often receive input parameters in analog form from such equipment and convert these parameters to digital form for processing in the computer or the data processing equipment. After the analog information has been converted to digital information and has been processed, the output information from the digital computer or the data processing equipment is often converted to analog form. By converting the digital information to analog form, the user can assimilate the information in ways which would be difficult if the information remained in digital form.

As digital computers and data processing equipment have become widespread throughout industry and have even become common in the home, the need for inexpensive, simple and reliable apparatus for converting information between digital and analog forms has become of increasing concern. A considerable effort has been devoted over a period of several decades to provide for converting apparatus which is simple, inexpensive and reliable. In spite of such efforts, the converting apparatus now in use does not meet such criteria.

The converters now in use also have other longstanding problems. For example, the converters now in use may not be monotonic unless they are quite expensive and complex. By "monotonic" is meant that digital information of progressively increasing value is converted to analog information of progressively increasing value without any decrease in the analog value as the digital value progressively increases. The converting apparatus now in use also has relatively high differential and integral non-linearities unless the apparatus is quite expensive and complex. Integral nonlinearities result from errors produced in a conversion between analog and digital values over a wide range of such values. Differential nonlinearities result from errors produced in a conversion between analog and digital values over a relatively narrow range of such values.

The converters now in general use also have a problem of major proportions. This results when particular digital values are increased incrementally by a single digit. For example, problems in the converters now in use result when a binary representation of "511" is converted into a binary representation of "512". This results from the fact that the binary representation of "511" is represented by a value of "0111111111" and a binary representation of "512" is represented by "1000000000" where the least significant digit is at the right. As will be seen, the value of each binary digit changes when the decimal value changes from "511" to "512". As the binary values change from "0111111111" to "1000000000", discontinuities may occur because there is a change between a binary value of "0" and a binary value of "1" at each digital position. These discontinuities may prevent the converters from being truly monotonic. This problem even exists in converters which are made quite complex in an attempt to overcome the problem.

The problems discussed in the previous paragraph have been aggravated by the increased speeds at which the computers and data processing equipment, and their associated converters, have been operated. For example, computers and data processing systems now operate at speeds of 100 megahertz and even higher. For example, at such frequencies, the converters have increased difficulties of operating on a monotonic basis with minimal integral and differential non-linearities.

This invention provides a digital-to-analog converter which overcomes the disadvantages of the prior art. The converter operates at high frequencies such as frequencies in the order of approximately one hundred (100) megahertz (100 mhz) and provides a monotonic output, with minimal integral and differential errors, even while operating at such high frequencies.

The apparatus of this invention converts a digital value represented by first and second pluralities of digital signals into an analog value represented by the magnitude of an analog signal. In one embodiment of the invention, output members in a matrix relationship having x and y inputs respectively receive signals in first and second pluralities cumulatively representing a digital value. These signals are decoded and are respectively introduced to x and y inputs to activate a particular output member common to a selected x row and a selected y column. The output members in the preceding rows and preceding the activated output member in the selected row are also activated.

Three transistor (all of the same type) current sources provide constant currents to the activated output members. In each current source, first transistor provides the constant currents, a second transistor constitutes a switch operative in response to binary input signals, and a third transistor in receives the constant current dependent upon the binary input to the second transistor. A circuit providing first and second reference voltages and including an operational amplifier produces a resultant voltage representing the difference between the reference voltages.

The resultant voltage controls the current flowing through fourth and fifth transistors, preferably in series, thereby regulating the value of the first reference voltage. The amplifier output also regulates the current in the first transistor of each current cell, and the voltage from the fifth transistor biases the third transistor in each current cell toward a conductive state. The three transistors in each current source and the fourth and fifth transistors may be C-MOS transistors of the p type.

In the drawings:

FIG. 1 is a schematic diagram of a system including a plurality of output members for converting digital values into corresponding analog values;

FIG. 2 is a diagram of circuitry for activating individual ones of the output members shown in FIG. 1;

FIG. 3 is a diagram of circuitry for activating individual ones of the output members shown in FIG. 1;

FIG. 4 illustrates an integrated circuit chip including the matrix shown in FIG. 1, circuitry corresponding to that shown in FIGS. 2 and 3 and other circuitry included in this invention;

Figure 5:
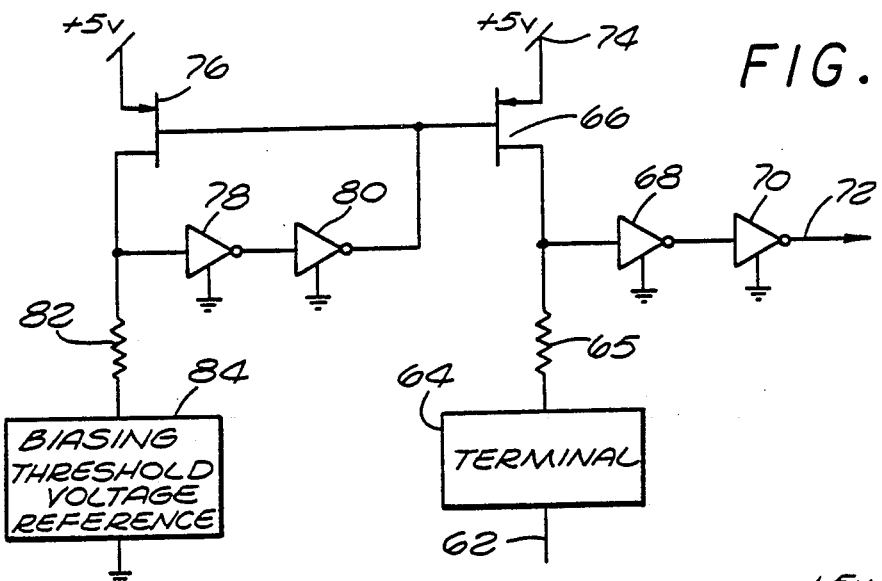
FIG. 5 illustrates circuitry included on the chip shown in FIG. 4 for converting output voltages from TTL logic devices external to the chip into input voltages for energizing C-Mos transistors disposed on the chip.

In one embodiment of the invention, a plurality of output members 10 are disposed in a matrix arrangement generally indicated at 12. Each of the output members may be a transistor such as disclosed in application Ser. No. 383,544 filed by Henry Katzenstein or a capacitor such as disclosed in application Ser. No. 553,041 filed by Henry Katzenstein. Application Ser. Nos. 383,544 and 553,041 are assigned of record to the assignee of record of this application.

The matrix arrangement 12 may be in any form. In the embodiment shown in FIG. 1, the matrix arrangement is defined by a plurality of rows and a plurality of columns. The matrix arrangement shown in FIG. 1 provides eight rows and eight columns but any number of rows or columns may be used. Input terminals 14 are provided to each of the rows and input terminals 16 are provided to each of the columns.

Input signals in a first plurality are introduced through lines 18 to the input terminals 14 and input signals are introduced through lines 20 to the input terminals 16. The input signals to the lines 18 are in a form such that all of the signals have a binary "0" except for one signal which has a binary "1". This signal prepares all of the output members 10 to become activated in the row receiving this signal. The input signals in the lines 18 may be obtained by decoding three (3) binary signals which are coded in a pattern to indicate the particular row to be prepared for activation at each instant. The three signals are introduced to a decoder 22 which operates to decode the signals into the eight signals which are introduced to the inputs 14.

In like manner, a decoder 24 is provided to decode three input signals in a second plurality. The three (3) input signals in the second plurality are decoded into eight signals which are introduced to the inputs 16. The decoders 22 and 24 are conventional in the prior art. The signals introduced to the decoder 24 may constitute least significant bits (LSB's in FIG. 1) and the signals introduced to the decoder 22 may constitute most significant bits (MSB's in FIG. 1).

As will be seen, when a row and a column are prepared for activation, a particular one of the output members 10 common to the prepared row and the prepared column becomes activated. For example, an output member 10a common to the third row and the third column may be activated at a particular instant. This indicates that the analog value is "19" since the output member 10a is the nineteenth output member counting (in the form of a raster scan) from the top row and the left column as a starting position.

FIG. 2 illustrates a circuit, generally indicated at 30, for activating output members such as the output member 10a (FIG. 1) and all of the output members preceding the output member 10a. The circuit 30 includes an "AND" network 32 which receives a signal on a line 34 corresponding to the line 18 (FIG. 1) for the third row and also receives a signal on a line 36 corresponding to the line 20 (FIG. 1) for the third column. As a result, the "AND" network 32 in FIG. 2 provides an output when the third row and the third column become prepared for activation.

The output signal from the "AND" network 32 is introduced to an "OR" network 38 which also receives the input from a line 40. The output from the "OR" network 38 is introduced to an inverter 42 and the output from the inverter 42 is passed to a line 44. An individual circuit 30 such as shown in FIG. 2 and described above is associated with each of the output members 10 in the matrix 12.

The output member 10a is activated when signals simultaneously pass through the lines 34 and 36 to the "AND" network 32. When the output member 10a becomes activated, all of the output members 10 in the rows preceding the output member 10a become simultaneously activated. This occurs by a passage of a signal through the line 40 for the circuits 30 controlling the activation of each of the output members 10 in each of the first and second rows in FIG. 1. The signal for the line 40 for the circuits 30 controlling the activation of each of the output members in each of the first and second rows may be obtained from the signal on the input 14 to the third row.

In addition to activating all of the output members in the first and second rows, the first and second output members in the third row are simultaneously activated when the output member 10a becomes activated. The activation of the first two members in the third row may be obtained by introducing the signal on the line 44 in FIG. 2 to circuitry for controlling the operation of the output members 10 common to the third row and the first and second columns in FIG. 1. This is shown in FIG. 3, as circuitry generally indicated at 50, for the output member common to the third row and the second column in FIG. 1. As will be seen, the circuitry shown in FIG. 3 is the same as that shown in FIG. 2 except that the line 44 is connected to an "or" network 52 corresponding to the "or" network 38 in FIG. 2.

Actually, the circuitry shown in FIG. 2 can be superseded for each of the output members by the circuitry shown in FIG. 3. The circuitry shown in FIG. 2 has been included in the drawings to simplify and clarify the operation of the converter shown in FIG. 1.

As will be seen from FIGS. 2 and 3, the output member 10a and all of the output members preceding the output member 10a are simultaneously activated when the analog value is "19". Each of the activated output members 10 produces a substantially constant current when activated as by circuitry shown in FIG. 9. These constant currents in the different output members are accumulated in a single output line to provide on this output line a current having a magnitude corresponding to the analog value of "19" in the example discussed in the previous paragraphs. Since this output current is obtained from a number of output members 10 each providing a substantially constant current, the output from the converter shown in FIG. 1 is monotonic.

As will be appreciated, the circuits for activating the output members in the top row in FIG. 1 do not need the line 40 in FIG. 2 or the corresponding line in FIG. 3. This results from the fact that there are no preceding rows of output members to be activated when the output members in the top row in FIG. 1 are being activated. Furthermore, the lines corresponding to the line 36 (FIG. 2) can receive an activating voltage at all times for the output members in the first column in FIG. 1. This results from the fact that the output member common to the first column and a particular row is activated when any of the output members in that row is activated. This output member remains activated regardless of which output member in the row is thereafter activated.

The output members 10 in the matrix 12 may be disposed on an integrated circuit chip generally indicated at 60 in FIG. 4. The circuitry on the chip 60 is preferably formed by C-Mos technology. However, the logic devices in other circuits external to the chip 60 may be formed by other technology such as TTL technology. The external logic devices utilizing TTL technology provide output voltages in the range of approximately 0.4 volts to approximately 2.4 volts with the logic threshold at approximately 1.4 volts. The C-Mos transistors on the chip 60 preferably operate with input voltages of approximately 0 volts to approximately 5 volts with a logic threshold of approximately 2.5 volts. It has previously been difficult to convert the output voltages from TTL logic devices to the proper input voltages for C-Mos transistors when it has been desired to operate digital-to-analog converters at high frequencies in excess of approximately twenty-five megahertz (25 mhz).

This invention provides circuitry for converting the output voltages from the TTL logic devices to the proper input voltages to the C-Mos transistors oven with considerable variation in supply voltage temperature and C-Mos process parameters. The circuitry of this invention provides such a conversion at frequencies in excess of eighty-five megahertz (85 mhz) with 3 micron gate length C-Mos technology. This frequency is well in excess of frequencies of approximately twenty-five megahertz (25 mhz), the maximum frequency capable of being provided by comparable circuitry now in use.

The circuitry of this invention uses only one power supply in converting from TTL logic devices to C-Mos transistors at high frequencies in excess of twenty-five megahertz (25 mhz). This is in contrast to digital-to-analog converters constructed from bipolar circuitry since, although bipolar circuits are relatively fast, they generally require two (2) power supplies, one providing a positive voltage and the other providing a negative voltage.

The circuitry of this invention for converting from TTL logic devices to C-Mos circuitry is shown in FIG. 5 for each digital signal input to integrated circuit chip 60 in FIG. 4. The circuitry shown in FIG. 5 includes a line 62 connected to the output of the external TTL logic device and to an input terminal 64 on the integrated circuit chip. A resistor 65 having a suitable value such as approximately 2,000 ohms is connected between the input 64 and the drain of a transistor 66 such as a C-Mos transistor of the p-type. A pair of inverters 68 and 70 are also connected to the drain of the transistor 66 and a line 72 is connected to the output of the inverter 70. The source of the transistor 66 receives an energizing voltage as at 74. This energizing voltage may be approximately +5 volts.

The gate of the transistor 66 has a common connection with the gate of a transistor 76 which may be a C-Mos transistor of the p-type. The characteristics of the transistor 76 and will preferably match the characteristics of the transistor 66 by virtue of being close on the integrated circuit chip to the transistor 66. The source of the transistor 76 has the same energizing voltage (+5 V.) applied to it as to the source of the transistor 66. A pair of inverters 78 and 80 are disposed electrically in series between the drain of the transistor 76 and the gates of the transistors 66 and 76.

A resistor 82 and a biasing threshold voltage reference 84 are in series between the drain of the transistor 76 and a reference potential such as ground. The resistor 82 may have a suitable value such as approximately two thousand (2000) ohms and in general matches the impedance of the resistor 65. The biasing network 84 provides the logic threshold voltage such as 1.4 volts. In the preferred embodiment, the resistor 82 and the reference voltage 84 are the equivalent of a resistance divider between the power supply and the reference potential such as ground.

Figure 6:
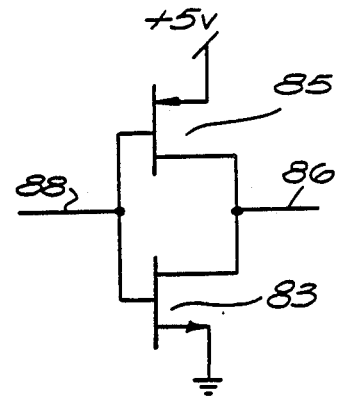
FIG. 6 illustrates the electrical construction of inverters included in the circuitry shown in FIG. 5.

The inverters 68 and 70 may be constructed in a manner substantially identical to the inverters 78 and 80. As shown in FIG. 6, each of the inverters 68, 70, 78 and 80 may be constructed from a pair of C-Mos transistors such as a C-Mos transistor 83 of the n-type and a C-Mos transistor 85 of the p-type. The drains of the transistors 83 and 85 have a common connection with an output line 86. The source of the transistor 83 is connected to a reference potential such as ground and the source of the transistor 85 is provided with the same energizing potential as the sources of the transistors 74 and 76. The gates of the transistors 83 and 85 have a common connection with an input line 88.

The area occupied by the transistor 85 on the chip 60 in FIG. 4 is preferably greater by a suitable factor such as a factor of approximately three (3) than the area occupied by the transistor 83. This difference in area causes the transconductance of the transistors 83 and 85 to become matched. Typically the difference in the areas occupied by the transistors 83 and 85 on the chip 60 results from a difference in the width of the transistors on the chip. If the transistors 83 and 85 are not provided with different areas, the transconductance of the transitor 83 will be approximately three (3) times greater than the transconductance of the transistor 85.

The circuitry shown in FIG. 5 operates to regulate the input voltage applied to inverter 78 such that this input voltage is at the C-Mos logic threshold of about 2.5 volts. The transistor 76 in such circuitry is generally conductive. Current from the transistor 76 through the resistor 82 causes a level shift voltage to be produced across the resistor 82. This voltage is the difference between the C-Mos threshold determined by the inverter 78 and the voltage provided by the threshold voltage reference 84. For operation as a logic translator between TTL (logic device and a C-Mos transistor) the threshold voltage reference is set to the TTL logic threshold of 1.4 volts.

If the threshold of the inverter 68 matches the threshold of the inverter 78 and if the impedances transistors 66 and 76 and resistors 82 and 65 match, then the transistor 66 will induce the same voltage across the resistor 65 as that across the resistor 82. Thus, when the input 62 is at the TTL threshold of approximately 1.4 volts, the inverter 68 will be at the C-Mos threshold of approximately 2.5 volts.

Figure 7:
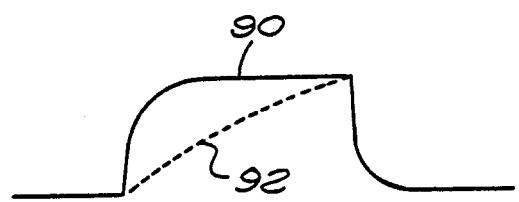
FIG. 7 illustrates waveforms of voltages produced in the circuitry shown in FIGS. 5 and 6.

The high speed operation of the signal carrying inverters 68 and 78 shown in FIG. 5 is facilitated by the balanced arrangement of such circuitry. Since the inverters 68 and 70 have C-Mos thresholds, the transconductances in the transistors 83 and 85 for each inverter are matched with each other. By providing such a balanced relationship in the circuitry shown in FIGS. 5 and 6, a signal such as illustrated at 90 in FIG. 7 is produced on the line 72 when an input signal representing a change between a binary "1" and a binary "0" is provided on the line 62. This signal has a relatively fast response, particularly on its leading edge, in comparison to a signal, such as that illustrated at 92 in FIG. 7, which is produced by the circuitry of the prior art. This is because, in the prior art, the threshold is changed between a C-Mos transistor (i.e. approximately 2.5 V) to a TTL logic device (i.e. approximately 1.4 V) by reducing the transconductance of a transistor corresponding to the transistor 85 relative to that of a transistor corresponding to the transistor 83.

Figure 8:
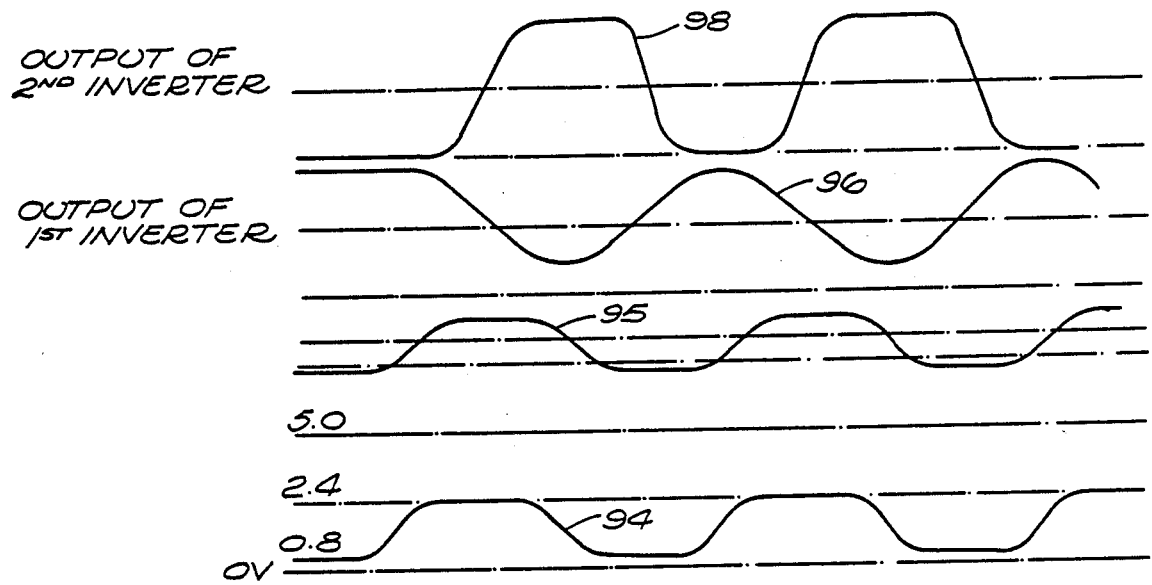
FIG. 8 illustrates waveforms of input voltages to the circuitry shown in FIG. 7 and output voltages from such circuitry.

The advantages of providing pairs of inverters such as the inverters 78 and 80 and the inverters 68 and 70 may be seen from the waveforms shown in FIG. 8. A waveform 94 in FIG. 8 illustrates the input to terminal 64 from the TTL logic device. A waveform 95 in FIG. 8 illustrates the input to the C-Mos transistor 66. A waveform 96 in FIG. 8 illustrates the signal produced by the inverter 68 in FIG. 5 and a waveform 98 in FIG. 8 illustrates the signal produced by the inverter 70 in FIG. 5. As will be seen, the signal 98 is squared relative to the signal 96. This results from the saturation of the signal from the inverter 68 by the increased amplitude provided by the inverter 70 in FIG. 5.

The circuitry shown in FIGS. 5 and 6 and described above has certain important advantages. It provides a simple and reliable conversion from the output voltages from the TTL logic devices to the input voltages to the C-Mos circuitry so that the digital-to-analog converter can be provided in C-Mos logic on an integrated circuit chip. In providing this conversion from the output voltages from the TTL logic devices to the input voltages to the C-Mos circuitry, the circuitry shown in FIGS. 5 and 6 and described above changes voltages between approximately 0.4 volts and 2.4 volts in the TTL logic devices (in representation of binary 1's and binary 0's) to voltages between approximately 1.5 and 3.5 volts as required by the C-Mos circuitry (in representation of binary 1's and binary 0's). The circuitry shown in FIGS. 5 and 6 provides such voltage conversions at frequencies in excess of eighty-five megahertz (85 mhz). The circuitry shown in FIGS. 5 and 6 provides such voltage conversions with only a single power supply providing approximately 5 volts.

The circuitry shown in FIGS. 5 and 6 also has other advantages of some importance. For example, if the inverter 78 is biased to become non-conductive and then transistor 76 is made non-conductive, signals may be introduced to the line 62 for passage to the inverter 68 with no level shift. Under such circumstances, the input circuit threshold on the line 72 is compatible with C-Mos logic external to the integrated circuit chip.

Figure 9:
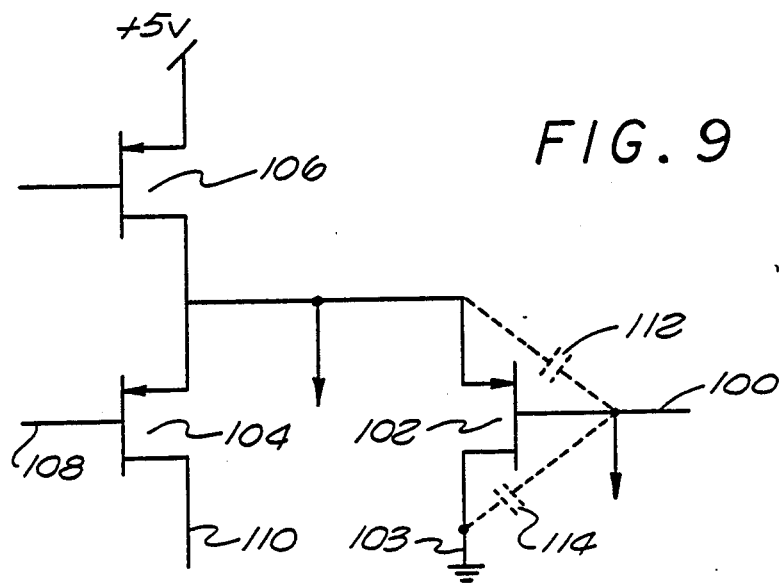
FIG. 9 is a diagram of circuitry for providing outputs from the matrix shown in FIG. 1, such output circuitry being included on the integrated circuit chip shown in FIG. 4.

FIG. 9 illustrates circuitry for producing output signals from the matrix 12 in FIG. 1 in accordance with the activation and deactivation of the individual output members 10. The circuitry shown in FIG. 9 includes an input line 100 from an individual one of the output members 10 in FIG. 1. The input line 100 is connected to the gate of a transistor 102 such as a C-Mos transistor of the p-type. The drain of the transistor 102 is connected through a line 103 to a reference potential such as ground. The source of the transistor 102 is common with the source of a transistor 104 and with the drain of a transistor 106. The transistors 104 and 106 may be C-Mos transistors of the p-type.

Figure 11:
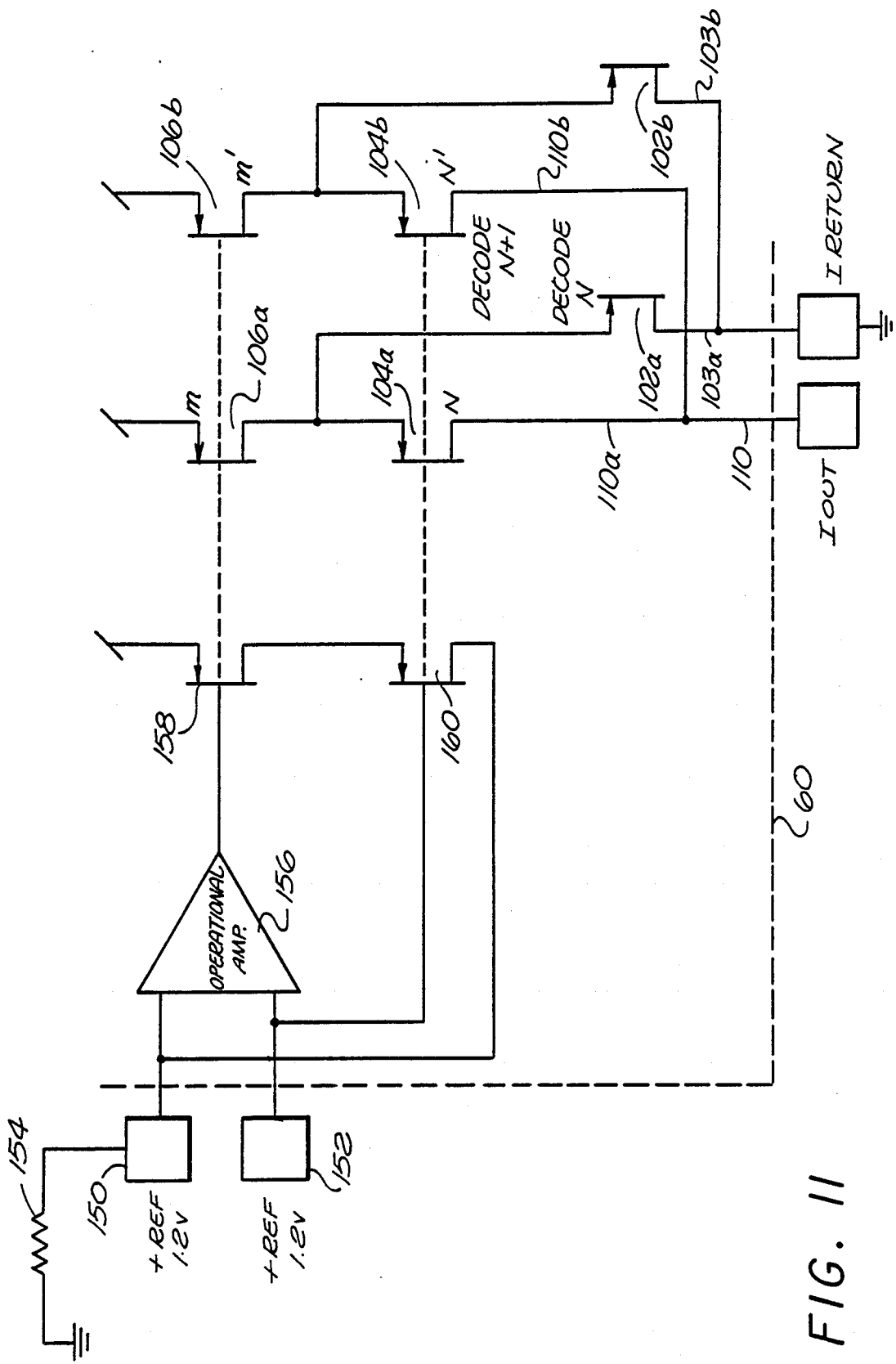
FIG. 11 is a schematic electrical diagram of the system formed by the electrical circuitry shown in the previous Figures.

The source of the transistor 106 receives an energizing potential such as approximately 5 volts. The gate of the transistor 106 receives a substantially constant bias voltage through a circuit which is shown in FIG. 11 and which will be described in detail subsequently. The gate of the transistor 104 receives a suitable biasing voltage such as a voltage of approximately 1.2 volts on a line 108. The output from the circuitry shown in FIG. 9 is produced on a line 110 which is connected to the drain of the transistor 104.

Distributed capacitances 112 (shown in broken lines in FIG. 9) exist between the gate and the source of the transistor 102 and distributed capacitances 114 (shown in broken lines in FIG. 9) exist between the gate and the drain of the transistor. These distributed capacitances are charged, during the time that the transistor 102 is nonconductive and they become discharged when the transistor 102 becomes conductive.

In output circuitry of the prior art, the discharge of a distributed capacitance corresponding to the capacitance 112 occurs through a circuit including the source and gate of a transistor and the discharge of a distributed capacitor corresponding to the capacitance 114 occurs through a circuit including the gate and drain of the transistor. However, in the prior art, such a transistor is an n-type rather than being the p-type shown for the transistor 102 in FIG. 9. As a result of the charge and discharge of such distributed capacitances, a current signal on the line 110 in FIG. 9 is produced in the n-type of transistor in the prior art with characteristics such as indicated at 116 in FIG. 10. This signal has a blip 118 which is produced upon a change from a non-conductive state to a conductive state in the operation of the n-type of transistor of the prior art. Similarly, the n-type of transistor corresponding in the prior art to the transistor 102 (p-type in this invention) produces a slow edge 119 when the state of the transistor changes from a conductive to a non-conductive state. This results from the fact that the drain of the transistor in the prior art (corresponding to the transistor 106) must swing over a larger voltage range than this invention requires. The parasitic capacitances corresponding to the capacitances 112 and 114 and the large voltage swings interfere with the operation of the output circuitry in the prior art and they slow the response of such circuitry.

Figure 10:
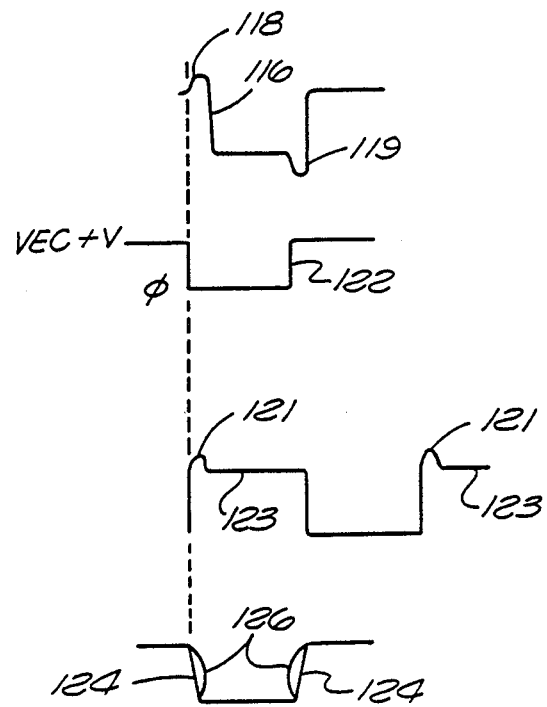
FIG. 10 illustrates waveforms of voltages and currents produced by the circuitry shown in FIG. 9.

When the associated one of the output members 10 (FIG. 1) is activated in this invention, it produces a signal 122 in FIG. 10 and introduces this signal to the line 100 (FIG. 9). This causes the transistor 102 to become conductive. The production of a conductive state in the transistor 102 is also facilitated because it is in series with the transistor 106. The current through the transistor 106, and therefore through the transistor 102, has a predetermined value because of the fixed bias introduced to the base of the transistor 106 through the circuitry shown in FIG. 11. When the transistor 102 becomes conductive, its parasitic capacitances 112 and 114 aid the switching of the output transistor 104 between the conductive and non-increasing states, thus increasing the switching speed of the transistor 104. Furthermore, the voltage swing at the drain of the transistor 106 is reduced and this further increases the speed of switching the transistor 104. This results in the current wave forms 124 (FIG. 10) in the line 110 in FIG. 9.

The flow of current through the transistors 106 and 104 produces a rise in voltage on the drain of the transistor 106 and on the source of the transistor 104. Since this rise in voltage is from a value of approximately +1 volts which is produced on the drains of the transistors 102 and 104 when the transistor 102 is conductive, the rise in voltage on the drain of the transistor 104 is quite fast. This is particularly true since the corresponding voltage on the drain of the n-type of transistor in the prior art corresponding to the transistor 102 (p-type in this invention) is approximately 0 volts.

As a result of the discharge of the distributed capacitances 112 and 114 through the transistor 102 in the circuitry shown in FIG. 9 when the transistor 102 becomes conductive, the slope of the signal produced on the output line 110 is more vertical than would be produced if the distributed capacitors 112 and 114 did not discharge through the transistor 102. This may be seen from a comparison of the leading edge of the signal 124 (FIG. 10) produced on the line 110 by the circuitry shown in FIG. 9 in comparison to the leading edge of a signal 126 produced on the same line by the circuitry of the prior art. Furthermore, as will be seen from the signal 124, no blips are produced in the leading and trailing edges of the signal.

The trailing edge of the output signal 124 produced by the circuitry shown in FIG. 9 is also sharper than the signal 126 produced by the circuitry of the prior art. This results from the reduced time, in comparison to the prior art, for the voltage on the drain of the transistor 104 to reach the proper value when the transistor 104 changes from a non-conductive state to a conductive state in the circuitry of this invention.

As will be seen from the above discussion, the circuitry shown in FIG. 9 and described above has certain advantages over the prior art. It provides on the output line 110 the signal 124 at a frequency in excess of eighty-five megahertz (85 mhz). It also provides the signal 124 with relatively sharp characteristics. This is in contrast to the prior art since the prior art provides the output signal 126 at a maximum frequency of approximately twenty-five megahertz (25 mhz) and with characteristics not nearly as sharp as those of the signal 124.

FIG. 11 illustrates circuitry for producing output currents from the different output members 10 in the matrix 12. The circuitry shown in FIG. 11 is disposed on the integrated circuitry chip 60 of FIG. 4. The chip 60 is illustrated in FIG. 11 by broken lines. The circuitry shown in FIG. 11 includes a pad 150 outside of the chip 60 for providing a reference voltage such as approximately 1.2 volts and a pad 152 outside of the chip 60 for providing a reference voltage such as approximately −1.2 volts. A resistance 154 is disposed electrically between the pad 150 and a reference potential such as ground.

Input terminals of an operational amplifier 156 are respectively connected to the pads 150 and 152. The output from the operational amplifier 156 is introduced to the gate of a transistor 158 such as a C-Mos transistor of the p-type. The source of the transistor 158 receives an energizing voltage such as approximately +5 volts. The drain of the transistor 158 and a source of a transistor 160 are common. Connections are respectively made from the gate and the drain of the transistor 160 to the pads 152 and 150. The transistor 160 may be a C-Mos transistor of the p-type.

The output of the operational amplifier 156 is introduced to the gates of transistors 106a, 106b, etc. corresponding to the transistor 106 in FIG. 9. Similarly, connections are made from the pad 152 to the gates of transistors 104a, 104b, etc. corresponding to the transistor 104 in FIG. 9. Transistors 102a, 102b, etc. (corresponding to the transistor 102 in FIG. 9) are respectively connected to the transistors 104a and 106a and to the transistors 104b and 104b in a manner shown in FIG. 9. Lines 110a, 110b, etc. are connected to the line 110 also shown in FIG. 9. Lines 103a, 103b, etc. correspond to the line 103 in FIG. 9.

A substantially constant current flows through a circuit including the pad 150, the resistance 154 and the reference potential such as ground. This current is balanced in the operational amplifier 156 by the current produced in the amplifier as the result of the introduction of the voltage from the pad 152 to the amplifier. The current in the operational amplifier biases the transistor 158 to a state of conductivity so that current flows through the transistors 158 and 160 to the pad 150 to correct for any imbalances between the current flowing through the operational amplifier 156 and the current flowing through the resistance 154. In this way, the bias introduced from the operational amplifier 156 to the gate of the transistor 158 is substantially constant.

The transistors 158 and 160 correspond respectively to the transistors 106a, 106b, etc., and the transistors 104a, 104b, etc. As a result, the same current flows through the transistors 106a and 104a and through the transistors 106b and 104b as flows through the transistors 158 and 160. As previously described, the transistors 106a, 104a and 102a are associated with an individual one of the output members 10 in the matrix 12 of FIG. 1 and the transistors 106b, 104b and 102b are associated with another individual one of the output members 10 in the matrix 12 of FIG. 1. As a result, each of the circuits 106a and 104a, 106b and 104b, etc., provides a substantially constant current to the output line 110 in FIGS. 9 and 11 when the associated one of the output members 10 becomes activated. The magnitude of the cumulative current on the output line 110 indicates the analog value corresponding to the value of digital signals introduced to the matrix 12 in FIG. 1. The analog indication represented by the current on the line 110 is monotonic and provides minimal integral and differential non-linearities.

Although this invention has been disclosed and illustrated with reference to particular embodiments, the principles involved are susceptible for use in numerous other embodiments which will be apparent to persons skilled in the art. The invention is, therefore, to be limited only as indicated by the scope of the appended claims.

I claim:

1. In combination for converting binary valves to analog values where the binary values are represented by first and second pluralities of binary signals respectively corresponding to rows and columns, a plurality of output means disposed in a matrix defining rows and columns and having first inputs to the rows and second inputs to the columns, first means for introducing the first plurality of signals to the inputs defining the rows, second means for introducing the second plurality of signals to the inputs defining the columns, third means responsive to a coincidence of the binary signals from the first and second pluralities on a particular one of the output means common to a particular row and a particular column for activating the particular output member, fourth means responsive to the activation of the particular output means for producing an activation of the output means preceding the particular output means in the particular row, and fifth means responsive to the activation of the particular output means for producing an activation of the output means in the rows preceding the particular row, the output means including:

pluralities of first, second and third transistors each of the p-type and each having conductive and non-conductive states, the first, second and third transistors being disposed in groups, the first second and third transistors in each group being associated with an individual one of the output means, the first transistors being associated with the third, fourth and fifth means to become conductive in response to the signals from any of the associated third, fourth and fifth means for activating the associated output means, each of the first transistors having distributed capacitances receiving a charge upon a state of non-conductivity in such first transistor and discharging this charge through such first transistor upon a state of conductivity in such first transistor to shorten the time for making the first transistor fully conductive, each of the second transistors being connected to the associated first transistor to become non-conductive upon a state of conductivity in such first transistor, such second transistor providing an output voltage dependent upon the state of conductivity or non-conductivity in such second transistor, the charging of the distributed capacitances in each of the first transistors during the state of non-conductivity in such first transistor being operative to prevent the output voltage from the associated second transistor from overshooting during the change in the operation of such associated second transistor from the state of non-conductivity to the state of conductivity, each of the third transistors being biased to produce continually a substantially constant current and being connected to the associated ones of the first and second transistors to pass the substantially constant current through the associated first transistor during the state of conductivity in the associated first transistor and through the associated second transistor during the state of conductivity in the associated second transistor, and means for accumulating the currents flowing through the second transistors to provide an indication of the analog value in accordance with the magnitude of such current.

2. A combination as set forth in claim 1, including, means for introducing an energizing voltage to each of the third transistors to obtain the flow of the substantially constant current through such transistor and the conductive one of the associated first and second transistors.

3. A combination as set forth in claim 1, including, the third means including an "and" network for obtaining the coincidence of the binary signals from the first and second pluralities of signals at the particular output means, and the fourth and fifth means including "or" networks for obtaining the activation of the output means preceding the particular output means in the particular row and the activation of the output means in the preceding rows.

4. A combination as set forth in claim 3, including, means for obtaining a substantially constant output current from each of the activated output members in the plurality.

5. A combination as set forth in claim 1, including the distributed capacitances across each of the first transistors including a distributed capacitance between the first and second elements in such transistor and a distributed capacitance between the first and third elements in such transistor.

6. A combination as set forth in claim 5 wherein the first, second and third transistors are p-type transistors.

7. A combination as set forth in claim 1, including, an additional first transistor having first, second and third elements, an additional second transistor having first, second and third elements, means for providing the energizing potential to the third element of the first additional transistors, means for providing a biasing potential to the first element of the first additional transistor to obtain continually the flow of the substantially constant current through the first additional transistor, the second element of the first additional transistor and the third element of the second additional transistor having a common connection, means for providing a feedback from the second element of the second additional transistor to the biasing means for the first element of the first additional transistor to maintain the current through the first additional transistor substantially constant, the first element of the first additional transistor being connected to the first elements of the third transistors, the first element of the second additional transistor being connected to the first elements of the second transistors.

8. A combination as set forth in claim 7 wherein the first, second and third transistors and the first and second additional transistors are p-type transistors and the first, second and third elements of the first and second transistors and the first and second additional transistors are respectively gates, sources and drains.

9. In combination for converting binary valves to analog values where the binary values are represented by first and second pluralities of binary signals respectively corresponding to rows and columns, a plurality of output means disposed in a matrix relationship defining rows and columns;

first means for decoding the first plurality of signals to obtain signals for introduction to the different rows of output means to prepare an individual one of the rows for activation, second means for decoding the second plurality of signals to obtain signals for introduction to the different columns of output means to prepare an individual one of the columns for activation, third means for introducing the decoded signals in the first plurality to the inputs to the rows to prepare the output means in the individual one of the rows for activation, fourth means for introducing the decoded signals in the second plurality to the inputs to the columns to prepare the output means in the individual one of the columns for activation and to obtain an activation of a particular one of the output means common to the prepared row and column; and fifth means responsive to the activation of the particular output means for obtaining an activation of the output means in the rows preceding the particular output means in the prepared row and an activation of the output means in the rows preceding the prepared row, the output means including:

first, second and third transistors, each of the first, second and third transistors having first, second and third elements, means responsive to the activation of the output means by the third, fourth and fifth means for introducing signals to the first elements in individual ones of the first transistors in accordance with such activation, means for biasing the first elements in the second transistors to a state of conductivity, means for biasing the first elements in the third transistors to obtain continuously a substantially constant flow of current through the third transistors, the second elements in the first and second transistors and the third element in the third transistor in each group having a common connection, the third elements in the first transistors receiving a reference voltage, means for applying an energizing voltage to the second elements in the third transistors to provide for the flow of the substantially constant current through each of the third transistors and through the conductive one of the first and second transistors associated with such third transistor, and means responsive to the cumulative currents on the third elements of the second transistors for providing an indication of the analog value, there being distributed capacitances across each of the first transistors, the distributed capacitances across each of the first transistors being charged during the state of non-conductivity in such first transistor and being operative during such charging to facilitate a state of conductivity in the associated one of the second transistors without any overshooting of the output voltage on the third terminal of such second transistor, the distributed capacitances across each of the first transistors being discharged upon the occurrence of a state of conductivity in such transistor to expedite the time that such first transistor passes the substantially constant current from the associated one of the third transistors and that the associated second transistor changes from a state of conductivity to a state of non-conductivity.

10. A combination as set forth in claim 9, including, means associated with the first, second and third transistors for providing a closed loop servo to assure that the current through each of the third transistors is substantially constant.

11. A combination as set forth in claim 9, including, the third means including "AND" networks, and the fourth and fifth means including "OR" networks.

12. A combination as set forth in claim 9, including, means for continually preparing the output means in a first one of the columns for activation.

13. In combination, a first transistor having first, second and third elements, a second transistor having first, second and third elements, the third element of the first transistor and the first element of the second transistor being common, an operational amplifier, means for providing a first reference voltage, means for providing a second reference voltage and for introducing the second reference voltage to the second element of the second transistor, means for providing a reference potential, an operational amplifier responsive to the first and second reference voltages for producing a resultant voltage representative of the difference between the first and second reference voltages and for introducing the resultant voltage to the second element of the first transistor, means for applying an energizing voltage to the first element of the first transistor, means for providing a particular impedance between the first reference voltage and the reference potential, means for feeding the voltage on the third element of the second transistor back to the first reference voltage means, and means operatively coupled to the second elements of the first and second transistors for producing through the first and second transistors a flow of current regulated by the resultant voltage introduced to the first element of the second transistor.

14. In combination as set forth in claim 13, an integrated circuit chip, the first and second transistors and the means for producing the regulated flows of current being disposed on the integrated circuit chip, the first and second reference voltage means being disposed externally of the integrated circuit chip.

15. In a combination as recited in claim 14, the first and second transistors being of the p-type, the impedance means constituting a resistance, and the reference potential constituting ground.

16. In a combination as set forth in claim 13, the first and second transistors being of the p-type.

17. In combination, a first transistor, a second transistor, an operational amplifier, means for introducing to the operational amplifier first and second reference voltages each having an opposite polarity for the other and each having at times a different magnitude than the other to obtain the production by the operational amplifier of a resultant voltage representing any difference between the magnitudes of the first and second reference voltages, means for providing a reference potential, an impedance connected to the first voltage reference means and the reference potential, means responsive to the resultant voltage from the operational amplifier for introducing the resultant voltage to the first transistor, means responsive to the voltage from the second transistor for introducing such voltage to the first reference voltage means to regulate the magnitude of the first reference voltage, and a plurality of current means each responsive to the first and second reference voltages for producing a substantially constant current in such current means.

18. In a combination as set forth in claim 17, each of the current means including third and fourth transistors, the third transistor being responsive to the resultant voltage from the operational amplifier, and the fourth transistor being responsive to the second reference voltage, to provide for the flow of the substantially constant current through the third and fourth transistors.

19. In a combination as set forth in claim 9, a plurality of means each individually operative to provide binary signals having first and second logic levels respectively representing a binary "1" and a binary "0", the binary signals cumulatively representing an analog value in digital form, and, each of the current means including a fifth transistor connected to the third and fourth transistors for such current means and responsive to an individual one of the binary signals for producing a flow of the substantially constant current through the associated fourth transistor upon the occurrence of the first logic level in such individual binary signal and a flow of the substantially constant current through such fifth transistor upon the occurrence of the second logic level in such individual binary signal.

20. In a combination as set forth in claim 19, the first and second transistors being of the p-type and the third, fourth and fifth transistors in each of the current means being of the p-type.

21. In combination, first and second transistors connected in a series relationship, means for providing first and second reference voltages, an operational amplifier responsive to the first and second reference voltages for providing an output voltage dependent upon any difference between the first and second reference voltages, means connected to the first reference voltage means for producing a reference current, means including the first and second transistors for responding to the output voltage from the operational amplifier to produce a voltage for introduction to the first reference voltage means to regulate the current through the first and second transistors in accordance with the reference current, and at least one current cell means operatively coupled to the operational amplifier and the second reference voltage means for producing the regulated current through the current cell means.

22. In a combination as set forth in claim 21, a plurality of means each operative to provide a binary signal having first and second logic levels respectively representing a binary "1" and a binary "0", and a plurality of current cell means including the one current cell means, each of the current cell means being responsive to an individual one of the binary signals and operatively coupled to the operational amplifier and the second reference voltage means for producing the regulated current through such current cell means in accordance with the logic levels of such individual one of the binary signals.

23. In a combination as set forth in claim 22, each of the current cell means having first and second paths and being constructed to respond to the associated binary signal for providing for the flow of the regulated current through the first path upon the occurrence of the first logic level in the binary signal and for providing for the flow of the regulated current through the second path upon the occurrence of the second logic level in the binary signal.

24. In a combination as set forth in claim 23, the first path in each of the current cell means being grounded and the second path in each of the current cell means provided an output and being connected to the second path in such current cell means.

25. In a combination as set forth in claim 21, means for providing a binary signal having first and second logic levels respectively representing a binary "1" and a binary "0", the current cell means providing first and second paths for flow of the regulated current and being responsive to the binary signal for providing for the flow of the regulated current through the first path upon the occurrence of the first logic level in the binary signal and for providing for the flow of the regulated current through the second path upon the occurrence of the second logic level in the binary signal.

26. In a combination as set forth in claim 25, the first path in the current cell means being grounded and the second path in the current cell means providing an output from the current cell means.

27. In combination, first and second transistors connected in a series relationship, means including a first reference voltage for providing a reference current, an operational amplifier, means including the first reference voltage means and a second reference voltage means and the operational amplifier for introducing to the first transistor a voltage representative of the difference between the first and second reference voltages to obtain a current through the first and second transistors, and a voltage in the second transistor, in accordance with such voltage difference, means responsive to the voltage in the second transistor for introducing such voltage to the operational amplifier to regulate the current through the first and second transistors, and means including a current cell responsive to the difference voltage and the second reference voltage for producing the regulated current through the current cell.

28. In a combination as set forth in claim 27, means for providing a binary signal having first and second logic levels respectively representing a binary "1" and a binary "0", the current cell being constructed to have first and second paths and being responsive to the logic levels of the binary signal to pass the regulated current through the first path upon the occurrence of the first logic level in the binary signal and to pass the regulated current through the second path upon the occurrence of the second logic level in the binary signal.

29. In a combination as set forth in claim 28,
the first transistor being responsive to the voltage difference, and the second transistor being responsive to the second reference voltage, to produce the regulated current in the first and second transistors,
means for providing a reference potential,
a resistor,
the reference current flowing through the first reference voltage means, the resistor and the reference potential means.

30. In a combination as set forth in claim 29,
means for providing a plurality of binary signals each having first and second logic levels respectively representing a binary "1" and a binary "0", each binary signal having an individual binary significance and the binary signals cumulatively representing an analog value, and
a plurality of current cells each constructed to have first and second paths and responsive to an individual one of the binary signals to pass the regulated current through the first path of such current cell upon the occurrence of the first logic level in the associated binary signal and to pass the regulated current through the second path of such current cell upon the occurrence of the second logic level in the associated binary signal.

31. In a combination a set forth in claim 27,
the first transistor being responsive to the voltage difference, and the second transistor being responsive to the second reference voltage, to produce the regulated current in the first and second transistors.

32. In combination,
means including a first reference voltage means for providing a regulated flow of current,
means for providing a second reference voltage,
means responsive to the first reference voltage and the second reference voltage for providing a voltage representative of the difference between the first and second reference voltages,
control means responsive to the difference voltage for producing a flow of current and a feedback voltage dependent upon such flow of current,
means responsive to the feedback voltage for providing for the regulation of the voltage difference to obtain the regulated current through the control means, and
means including a current cell responsive to the voltage difference and the second reference voltage for producing the regulated current through the current cell.

33. In a combination as set forth in claim 32,
means for providing a binary signal having first and logic levels respectively representing a binary "1" and a binary "0", and
means included in the current cell and responsive to the binary signal for defining first and second paths and for producing the regulated current through the first path upon the occurrence of the first logic level in the binary signal and for producing the regulated current through the second path upon the occurrence of the second logic level in the binary signal.

34. In a combination as set forth in claim 33 wherein the voltage difference means includes an operational amplifier responsive to the first and second reference voltages to produce the difference voltage and the control means include at least one transistor connected to receive the difference voltage from the operational amplifier and constructed to produce a current having a magnitude variable in accordance with the magnitude of such difference voltage.

35. In a combination as set forth in claim 34,
the control means further including a second transistor responsive to the second reference voltage to produce a current through the second transistor, the first and second transistors being connected in a circuit to provide a common flow of current through the transistors.

* * * * *

REEXAMINATION CERTIFICATE (1783rd)
United States Patent [19]
Colles

[11] B1 4,904,922

[45] Certificate Issued  Sep. 1, 1992

[54] APPARATUS FOR CONVERTING BETWEEN DIGITAL AND ANALOG VALVES

[75] Inventor: Joseph H. Colles, Oceanside, Calif.

[73] Assignee: Brooktree Corporation, San Diego, Calif.

Reexamination Request:
No. 90/002,287, Feb. 21, 1991

Reexamination Certificate for:
Patent No.: 4,904,922
Issued: Feb. 27, 1990
Appl. No.: 225,055
Filed: Jul. 26, 1988

Related U.S. Application Data

[62] Division of Ser. No. 104,690, Oct. 5, 1987, Pat. No. 4,831,282, which is a division of Ser. No. 714,503, Mar. 21, 1985, abandoned.

[51] Int. Cl.$^5$ .............................................. G05F 3/08
[52] U.S. Cl. ................................... 323/316; 307/448; 307/576; 341/136
[58] Field of Search ........................................ 323/317

[56] References Cited

U.S. PATENT DOCUMENTS

4,393,370  7/1983  Hareyama ........................... 140/347
4,490,634  12/1984  Hareyama ........................... 307/573

FOREIGN PATENT DOCUMENTS

56-75726  6/1981  Japan .
56-115027  9/1981  Japan .

OTHER PUBLICATIONS

"IC Converter Design Insights", from Analog Devices publication, pp. 277-296, dated prior to 1985.

Sippl, "Microcomputer Dictionary", Second Edition, Howard W. Sams & Co., 1981, p. 305.

"TML1840 Video DAC"; Telmos, Inc.; pp. 62073-62077.

"A High-Speed NMOS A/D Converter With a Current Source Array"; Post, et al.; IEEE Journal of Solid-State Circuits; vol. SC-15, No. 3, Jun. 1980; pp. 295-301.

*Primary Examiner*—William H. Beha, Jr.

[57] ABSTRACT

Output members in a matrix relationship having x and y inputs respectively receive signals in first and second pluralities cumulatively representing a digital value. These signals are decoded and are respectively introduced to the x and y inputs to activate a particular output member common to a selected x row and a selected y column. The output members in the preceding rows and preceding the activated output member in the selected row are also activated. Three-transistor (all of the same type) current sources provide constant currents to the activated output members. In each current source, a first transistor provides the constant current, a second transistor in each current source constitutes a switch operative in response to binary input signals, and a third transistor receives the constant current dependent upon the binary input to the second transistor. A circuit providing first and second reference voltages and including an operational amplifier produces a resultant voltage representing the difference between the reference voltages. The resultant voltage controls the current flowing through fourth and fifth transistors, preferably in series, thereby regulating the value of the first reference voltage. The amplifier output also regulates the current in the first transistor of each current cell, and the voltage from the fifth transistor biases the third transistor in each current cell toward a conductive state. The three transistors in each current source and the fourth and fifth transistors may be C-MOS transistors of the p type.

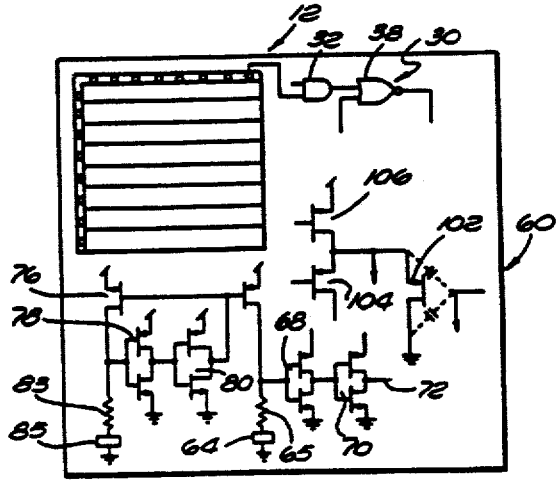

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

ONLY THOSE PARAGRAPHS OF THE SPECIFICATION AFFECTED BY AMENDMENT ARE PRINTED HEREIN.

Column 9, lines 55–66:
FIG. 11 illustrates circuitry for producing output currents from the different output members 10 in the matrix 12. The circuitry shown in FIG. 11 is disposed on the integrated circuitry chip 60 of FIG. 4. The chip 60 is illustrated in FIG. 11 by broken lines. The circuitry shown in FIG. 11 includes a pad 150 outside of the chip 60 for providing a reference voltage such as approximately 1.2 volts and a pad 152 outside of the chip 60 for providing a reference voltage such as approximately [−]+1.2 volts. A resistance 154 is disposed electrically between the pad 150 and a reference potential such as ground.

AS A RESULT OF REEXAMINATION, IT HAS BEEN DETERMINED THAT:

The patentability of claims 21–23 and 25–31 is confirmed.

Claims 1, 6–9, 11, 13, 17, 19, 24 and 32 are determined to be patentable as amended.

Claims 2–5, 10, 12, 14–16, 18, 20 and 33–35, dependent on an amended claim, are determined to be patentable.

New claims 36–50 are added and determined to be patentable.

1. In combination for converting binary [valves] *values* to analog values where the binary values are represented by first and second pluralities of binary signals respectively corresponding to rows and columns,
   a plurality of output means disposed in a matrix defining rows and columns and having first inputs to the rows and second inputs to the columns,
   first means for introducing the first plurality of signals to the inputs defining the rows,
   second means for introducing the second plurality of signals to the inputs defining the columns,
   third means responsive to a coincidence of the binary signals from the first and second pluralities on a particular one of the output means common to a particular row and a particular column for activating the particular output [member] *means,*
   fourth means responsive to the activation of the particular output means for producing an activation of the output means preceding the particular output means in the particular row, and
   fifth means responsive to the activation of the particular output means for producing an activation of the output means in the rows preceding the particular row, the output means including:
   pluralities of first, second and third transistors each of the p-type and each having conductive and non-conductive states, the first, second and third transistors being disposed in groups, the first, second and third transistors in each group being associated with an individual one of the output means,
   the first transistors being associated with the third, fourth and fifth means to become conductive in response to the signals from any of the associated third, fourth and fifth means for activating the associated output means, each of the first transistors having distributed capacitances receiving a charge upon a state of non-conductivity in such first transistor and discharging this charge through such first transistor upon a state of conductivity in such first transistor to shorten the time for making the [first] *second* transistor fully [conductive] *non-conductive,*
   each of the second transistors being connected to the associated first transistor to become non-conductive upon a state of conductivity in such first transistor, such second transistor providing an output voltage dependent upon the state of conductivity or non-conductivity in such second transistor,
   the charging of the distributed capacitances in each of the first transistors during the state of non-conductivity in such first transistor being operative to prevent the output voltage from the associated second transistor from overshooting during the change in the operation of such associated second transistor from the state of non-conductivity to the state of conductivity,
   each of the third transistors being biased to produce continually a substantially constant current and being connected to the associated ones of the first and second transistors to pass the substantially constant current through the associated first transistor during the state of conductivity in the associated first transistor and through the associated second transistor during the state of conductivity in the associated second transistor, and
   means for accumulating the currents flowing through the second transistors to provide an indication of the analog value in accordance with the magnitude of such current.

6. A combination as set forth in claim 5 wherein [the first, second and third transistors are p-type transistors] *the output voltages from the second transistors in the plurality have a common connection.*

7. A combination as set forth in claim 1, including
   an additional first transistor having first, second and third elements,
   an additional second transistor having first, second and third elements,
   means for providing the energizing potential to the third element of the first additional [transistors] *transistor,*
   means for providing a biasing potential to the first element of the first additional transistor to obtain continually the flow of the substantially constant current through the first additional transistor,
   the second element of the first additional transistor and the third element of the second additional transistor having a common connection, means for providing a feedback from the second element of the second additional transistor to the biasing means for the first element of the first additional transistor to maintain the current through the first additional transistor substantially constant, the first element of the first additional transistor being connected to the first elements of the third transistors, the first element of the second additional transistor being connected to the first elements of the second transistors.

8. A combination as set forth in claim 7 wherein [the first, second and third transistors and] the first and second additional transistors are p-type transistors and the first, second and third elements of the first and second transistors and the first and second additional transistors are respectively gates, sources and drains.

9. In combination for converting binary [valves] *values* to analog values where the binary values are represented by first and second pluralities of binary signals respectively corresponding to rows and columns, a plurality of output means disposed in a matrix relationship defining rows and columns, first means for decoding the first plurality of signals to obtain signals for introduction to the different rows of output means to prepare an individual one of the rows for activation, second means for decoding the second plurality of signals to obtain signals for introduction to the different columns of output means to prepare an individual one of the columns for activation, third means for introducing the decoded signals in the first plurality to the inputs to the rows to prepare the output means in the individual one of the rows for activation, fourth means for introducing the decoded signals in the second plurality to the inputs to the columns to prepare the output means in the individual one of the columns for activation and to obtain an activation of a particular one of the output means common to the prepared row and column; and fifth means responsive to the activation of the particular output means for obtaining an activation of the output means [in the rows] preceding the particular output means in the prepared row and *for obtaining* an activation of the output means in the rows preceding the prepared row, the output means including:

first, second and third transistors, each of the first, second and third transistors having first, second and third elements, means responsive to the activation of the output means by the third, fourth and fifth means for introducing signals to the first elements in individual ones of the first transistors in accordance with such activation, means for biasing the first elements in the second transistors to a state of conductivity, means for biasing the first elements in the third transistors to obtain continuously a substantially constant flow of current through the third transistors, the second elements in the first and second transistors and the third element in the third transistor in each group having a common connection, the third elements in the first transistors receiving a reference voltage, means for applying an energizing voltage to the second elements in the third transistors to provide for the flow of the substantially constant current through each of the third transistors and through the conductive one of the first and second transistors associated with such third transistor, and means responsive to the cumulative currents on the third elements of the second transistors for providing an indication of the analog value, there being distributed capacitances across each of the first transistors, the distributed capacitances across each of the first transistors being charged during the state of non-conductivity in such first transistor and being operative during such charging to facilitate a state of conductivity in the associated one of the second transistors without any overshooting of the output voltage on the third [terminal] *element* of such second transistor, the distributed capacitances across each of the first transistors being discharged upon the occurrence of a state of conductivity in such transistor to expedite the time that such first transistor passes the substantially constant current from the associated one of the third transistors and that the associated second transistor changes from a state of conductivity to a state of non-conductivity.

11. A combination as set forth in claim [9] *5*, including, the third means including "AND" networks, and the fourth and fifth means including "OR" networks.

13. In combination, a first transistor having first, second and third elements, a second transistor having first, second and third elements, the third element of the first transistor and the first element of the second transistor being common, an operational amplifier, means for providing a first reference voltage, means for providing a second reference voltage and for introducing the second reference voltage to the second element of the second transistor, means for providing a reference potential, an operational amplifier responsive to the first and second reference voltages for producing a resultant voltage representative of the difference between the first and second reference voltages and for introducing the resultant voltage to the second element of the first transistor, means for applying an energizing voltage to the first element of the first transistor, means for providing a particular impedance between the first reference voltage and the reference potential, means for feeding the voltage on the third element of the second transistor back to the first reference voltage means, and means operatively coupled to the second elements of the first and second transistors for producing through the first and second transistors a flow of current regulated by the resultant voltage introduced to the [first] *second* element of the [second] *first* transistor.

17. In combination, a first transistor, a second transistor, an operational amplifier, means for introducing to the operational amplifier first and second reference voltages each having [an opposite] *the same* polarity [for] *as* the other and each having at times a different magnitude than the other to obtain the production by the operational amplifier of a resultant voltage representing any difference between the magnitudes of the first and second reference voltages, means for providing a reference potential, an impedance connected to the first voltage reference means and the reference potential, means responsive to the resultant voltage from the operational amplifier for introducing the resultant voltage to the first transistor, means responsive to the voltage from the second transistor for introducing such voltage to the first reference voltage means to regulate the magnitude of the first reference voltage, and a plurality of current means each responsive to the [first] *resultant* and second reference voltages for producing a substantially constant current in such current means.

19. In a combination as set forth in claim [9] *18*, a plurality of means each individually operative to provide binary signals having first and second logic levels respectively representing a binary "1" and a binary "0", the binary signals cumulatively representing an analog value in digital form, and [,]

each of the current means including a fifth transistor connected to the third and fourth transistors for such current means and responsive to an individual one of the binary signals for producing a flow of the substantially constant current through the associated fourth transistor upon the occurrence of the first logic level in such individual binary signal and a flow of the substantially constant current through such fifth transistor upon the occurrence of the second logic level in such individual binary signal.

24. In a combination as set forth in claim 23, the first path in each of the current cell means being grounded and the second path in each of the current cell means [provided] *providing* an output and being connected to the second path in [such] *the other* current cell means.

32. In combination, means including a first reference voltage means for providing a regulated flow of current, means for providing a second reference voltage, means responsive to the first reference voltage and the second reference voltage for providing a voltage representative of the difference between the first and second reference voltages, control means responsive to the difference voltage for producing a *regulated* flow of currrent and a feedback voltage dependent upon such flow of current, means responsive to the feedback voltage for providing for the regulation of the voltage difference to obtain the regulated current through the control means, and means including a current cell responsive to the voltage difference and the second reference voltage for producing the regulated current through the current cell.

36. A combination as set forth in claim 13, including, a current cell formed from first, second and third additional transistors,

*means for applying the energizing voltage to the first element of the first additional transistor,*

*means for applying the voltage on the second element of the first transistor to the second element of the first additional transistor to obtain a substantially constant current through the first additional transistors,*

*means for applying the voltage on the second element of the second transistor to the second element of the second additional transistor,*

*the third element of the first additional transistor being connected to the first elements of the second and third transistors,*

*means for applying to the second element of the third additional transistor a voltage having first and second logic levels respectively to represent a binary "1" and a binary "0",*

*means connected to the third element of the second additional transistor to provide a current having an amplitude indicative of a binary "1" or a binary "0", and*

*means for introducing a reference potential to the third element of the third additional transistor.*

*37. A combination as set forth in claim 36, including;*

*the first and second transistors and the first, second and third additional transistors being of the p-type,*

*the third additional transistor having distributed capacitances receiving a charge upon a state of non-conductivity in such third additional transistor and discharging this charge through such third additional transistor upon a state of non-conductivity in such third additional transistor to shorten the time for making such third additional transistor fully conductive, the charging of the distributed capacitances in the third additional transistor during the state of non-conductivity in such third additional transistor being operative to prevent the voltage on the third element of the second additional transistor from overshooting during the change in the operation of the second additional transistor from the state of non-conductivity to the state of conductivity.*

*38. In a combination as recited in claim 21,*

*means for introducing the second reference voltage to the second transistor to regulate the bias on the second transistor,*

*the first and second transistors being of the p-type.*

*39. In a combination as set forth in claim 38,*

*the current cell means including first, second and third additional transistors,*

*the first additional transistor being operatively coupled to the operational amplifier,*

*the second additional transistor being operatively coupled to the second reference voltage means,*

*the third additional transistor receiving a binary input signal having first and second voltage levels respectively to represent binary "1" and a binary "0",*

*the first, second and third additional transistors being connected to obtain from the second additional transistor an output current dependent upon the logic level of the binary input signal introduced to the third additional transistor,*

*the first, second and third additional transistors being of the p-type.*

*40. In a combination as set forth in claim 27,*

*means for introducing the second reference voltage to the second transistor for regulating the voltage introduced from the second transistor to the operational amplifier to regulate the current through the first and second transistors.*

41. In a combination as set forth in claim 40,
the current cell being a first current cell,
a plurality of current cells each corresponding to the first current cell and each responsive to the difference voltage and the second reference voltage and each responsive to the binary indication introduced to such cell for producing the regulated current through such cell,
the regulated currents through the first current cell and the plurality of current cells being combined to produce a current having a magnitude representing analog values of the binary indications.

42. In a combination as set forth in claim 39,
the first transistor being responsive to the voltage difference, and the second transistor being responsive to the second reference voltage, to produce the regulated current in the first and second transistors,
the currrent cell means including first, second and third additional transistors,
means for providing a binary signal having first and second logic levels respectively representing a binary "1" and a binary "0" and for introducing the binary signal to the third additional transistor,
the current cell means being constructed to have a first path through the third transistor and a second path through the second transistor to pass the regulated current through the first path upon the occurrence of the first logic level in the binary signal and to pass the regulated current through the second path upon the occurrence of the second logic level in the binary signal,
the first additional transistor being responsive to the voltage difference, and the second additional transistor being responsive to the second reference voltage, to produce the regulated current in the first and second additional transistors.

43. In a combination as set forth in claim 22,
each of the current cell means including a plurality of transistors of the p-type.

44. In a combination as recited in claim 42,
the current cell means constituting a first current cell means,
a plurality of additional current cell means each including additional transistors corresponding to the first, second and third transistors in the first current cell means and each constructed and operative in the same manner as the first current cell means, and
there being a common connection between the second paths in the first current cell means and in the plurality of current cell means.

45. In a combination as set forth in claim 44,
the additional transistors in the plurality of current cell means being of the p-type.

46. In a combination as set forth in claim 35,
the current cell including first and second additional transistors respectively responsive to the voltage difference and the second reference voltage for producing a substantially constant flow of current through the first additional transistor and for producing the flow of such current through the second additional transistor in accordance with the logic level of the binary input signal.

47. In combination as set forth in claim 35,
the first and second transistors constituting p-type transistors.

48. In a combination as set forth in claim 32,
the control means including a first transistor responsive to the difference voltage between the first and second reference voltages, and
the control means including a second transistor responsive to the second reference voltage to produce a substantially constant flow of current through the first and second transistors, the first and second transistors being connected in a circuit to provide a common flow of current through the transistors,
the current cell including first, second and third additional transistors,
means for providing a binary signal having first and second logic levels respectively representing a binary "1" and a binary "0",
the third additional transistors in the current cell being responsive to the input signal to control the flow of current through the second additional transistor,
the first and second additional transistors being respectively responsive to the voltage difference and the second reference voltage for producing a substantially constant flow of current through the first additional transistor and for producing the flow of such current through the second additional transistor in accordance with the logic level of the binary input signal.

49. In a combination as set forth in claim 48,
the first and second transistors and the first, second and third additional transistors being of the p-type.

50. In a combination as set forth in claim 49,
the voltage difference means including an operational amplifier responsive to the first and second reference voltages to produce the difference voltage.

* * * * *